United States Patent [19]

Agraz-Guerena et al.

[11] 3,841,918

[45] Oct. 15, 1974

[54] METHOD OF INTEGRATED CIRCUIT FABRICATION

[75] Inventors: Jorge Agraz-Guerena, Whitehall; Paul Alexander Gary, Easton; Martin Paul Lepselter, Hanover Township, Northampton County, all of Pa.

[73] Assignee: Bell Telephone Laboratories, Incorporated, Murray Hill, N.J.

[22] Filed: Dec. 1, 1972

[21] Appl. No.: 311,289

[52] U.S. Cl................... 148/1.5, 148/175, 148/187, 148/188, 156/17, 317/235

[51] Int. Cl. .............................................. H01l 7/54

[58] Field of Search ............ 148/1.5, 175, 187, 188; 317/235; 156/17

[56] References Cited

UNITED STATES PATENTS

| | | | |
|---|---|---|---|
| 3,615,932 | 10/1971 | Makimoto et al. | 148/175 |
| 3,648,125 | 3/1972 | Peltzer | 148/175 X |
| 3,648,130 | 3/1972 | Castrucci et al. | 148/175 |
| 3,655,457 | 4/1972 | Duffy et al. | 148/1.5 |
| 3,736,192 | 5/1973 | Tokuyama et al. | 148/1.5 |
| 3,748,545 | 7/1973 | Beale | 148/175 X |

*Primary Examiner*—L. Dewayne Rutledge
*Assistant Examiner*—J. M. Davis
*Attorney, Agent, or Firm*—G. W. Houseweart; P. Abolins; P. V. D. Wilde

[57] ABSTRACT

Method for fabricating a semiconductor integrated circuit structure. Improved control over the number of active base zone impurities, and therefore, over transistor gain, is achieved by ion implanting a buried base zone into an epitaxial layer formed on a substrate containing a collector, and then introducing impurities into the epitaxial layer portion substantially only above the buried base zone to form an emitter zone. Additionally, deep collector contact impurities are implanted through a silicon nitride mask into the epitaxial layer to improve control of series collector resistance. Heating in an oxidizing atmosphere diffuses the implanted collector contact impurities through the epitaxial layer to form a deep collector contact zone and oxidizes the zone's unmasked top surface to form a precisely aligned protective cap.

14 Claims, 14 Drawing Figures

METHOD OF INTEGRATED CIRCUIT FABRICATION

BACKGROUND OF THE INVENTION

1. Field of the Invention

This invention relates to fabrication of semiconductor devices; and more particularly to a method for fabricating integrated circuits with a greater ease resulting partially from improved control of transistor gain and improved control of series collector resistors for use as circuit elements.

2. Description of the Prior Art

Typically, fabricating planar integrated circuits includes forming an epitaxial layer of relatively uniform impurity concentration upon an entire surface of a substrate, and then forming functional zones such as base zones, emitter zones, collector zones and resistor zones in the layer during subsequent processing. Certain ones of known prior art methods have formed a collector zone in the substrate, formed an emitter zone in the epitaxial layer above the collector zone and used the intervening portion of the epitaxial layer above the collector zone as a base zone. Such methods have been described both in U.S. Pat. Nos. 3,575,741 issued to B. T. Murphy, Apr. 20, 1971 and 3,648,125 issued to D. L. Peltzer, Mar. 7, 1972.

In structures formed by such methods, the active base zone is that part of the epitaxial layer which extends inward from the emitter to the collector. Since the number of impurities in the active base zone has a first order effect on the gain of a bipolar device and since the concentration of the impurities is uniform throughout the epitaxial layer, the thickness of the epitaxial layer and the depth of the emitter have a significant effect on the gain.

Epitaxial growth and diffusion are taught in the previously mentioned patents to achieve control of the number of impurities in the active base zone. However, the processes of epitaxial growth and diffusion are known to have serious limitations with respect to controlling the number of impurities and, therefore, controlling the transistor gain.

To improve ease of fabrication, it is desirable to improve control of the number of impurities in the active base zone without increasing the need for more precise control of either the thickness of the epitaxial layer or the depth of the emitter. Ion beam implantation is a means of introducing a well-controlled number of impurities and controlling circuit dimensions. For example, *Electronics*, Vol. 42, No. 19, page 226, Sept. 15, 1969 describes the production of a high frequency transistor where implantation is used to form a base zone which starts at the surface of the semiconductor and extends into it. However, since the emitter is formed into a high impurity density part of the base, the number of impurities in the active base zone still depends greatly upon the depth of the emitter.

It is, therefore, an object of this invention to provide a process for fabricating integrated circuit devices with improved control of the gain of transistors therein without increasing the difficulty of fabrication by increasing the requirements on the epitaxial deposition and emitter formation.

Also in accordance with the above mentioned patents, zones are formed entirely through the epitaxial layer to intersect the buried collector zones thereby providing electrical connections from the surface of the epitaxial layer to the collector zones. These zones are termed "deep collector contact zones." Control of the number of impurities in these zones determines control of the resistance of the zones. Diffusion has been used to form these zones in some prior art; yet, diffusion has serious limitations with respect to easily controlling the number of impurities introduced.

Furthermore, in certain ones of known prior art methods a subsequent diffusion is desired into only that portion of the epitaxial layer which forms the upper portion of the base zone to provide improved ohmic contact to the base zone. For ease of fabrication the diffusion is done nonselectively into the entire surface of the epitaxial layer. Hence, this diffusion results in some diffused impurities entering the deep collector contact zones where they are not desired.

As a result, it is a further object of this invention to better control the impurities introduced into the deep collector contact zone so they can be expeditiously used as resistive elements, and to concurrently protect the zones from any subsequently diffused impurities without an additional masking step.

SUMMARY OF THE INVENTION

To these and other ends, semiconductor integrated circuits are fabricated in accordance with this invention by implanting deep collector contact impurities through a mask, heating in an oxidizing atmosphere to diffuse the implanted impurities to form a deep collector contact zone and to grow an oxide selectively in each mask opening to form a protective cap above each zone. Also, fabrication in accordance with this method includes ion implanting a buried zone of impurities to form the active base zone.

In accordance with a particular embodiment of this invention, a semiconductor integrated circuit is fabricated by forming into a first major surface of a substrate of a first conductivity type a first pattern of zones of a second conductivity type. Subsequently, an epitaxial layer of first conductivity type is formed over the first major surface and it thereby buries the first pattern of zones which can be used as collectors for transistors.

An important step in the method is implanting impurities through a mask into the epitaxial layer to form a deep collector contact zone having a well-controlled number of impurities and therefore a well-controlled resistivity. After implantation, heating in an oxidizing atmosphere diffuses the impurities and forms a thermal oxide cap selectively in the mask opening. To accomplish this selective oxidation, the implantation mask is selected to be a material which also prevents oxidation. Additionally, the masking material is selected from those materials which can be etched selectively with respect both to oxide and to semiconductor material and is, therefore, easily removed without a photolithographic step. After removal of the mask, the oxide cap can be used to selectively shield the deep collector contact zone from subsequent undesired introductions of impurities without additional processing steps.

Improving control of transistor gain is achieved, in accordance with this invention, by the further step of implanting a buried base zone inside the epitaxial layer and then forming an emitter zone extending from the surface of the epitaxial layer inward toward the buried base. Both the emitter and base zones are characterized by impurity distributions which have a peak concentration and then diminish in concentration as the other zone is approached. As a result, the emitter diffusion will compensate and therefore neutralize the effect of the implanted base impurities only to the extent that the diminishing tail of the emitter impurity distribution intersects the diminishing tail of the buried base impurity distribution. Furthermore, because the intersecting tails compensate relatively few impurities there can be variation of the emitter depth without substantially affecting the number of implanted base impurities which number is very well controlled and affects gain.

It will be appreciated that the described method can have several variations when used to form an integrated circuit. In particular, the deep collector contact zone can be shaped to isolate the portion of the epitaxial layer above the collector zone from other such portions. Alternatively, isolation can be provided by forming an oxide zone through the epitaxial layer inward to the substrate so it intersects the edge of the collector zone.

DETAILED DESCRIPTION

Figure 1:
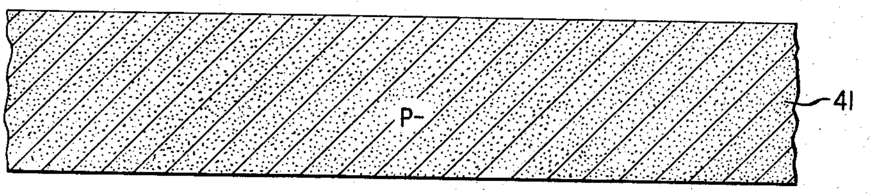
FIGS. 1 through 3 show a cross section of a semiconductor wafer as it appears after fabrication in accordance with initial steps of preferred embodiments of the method of this invention.
Figure 2:
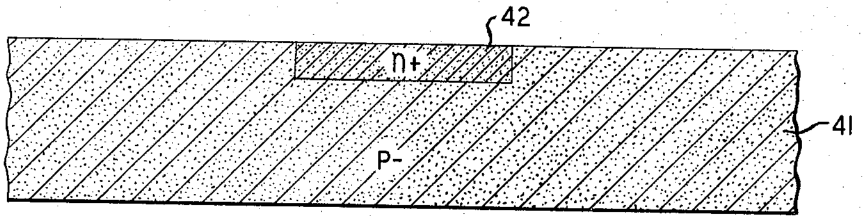

Referring to FIG. 1, fabrication in accordance with a first-described embodiment begins by forming a monocrystalline silicon bulk portion 41 which may be a portion of a slice of P-type conductivity produced by boron doping to have a substantially uniform resistivity of about 10 ohm-centimeters. Then, as shown in FIG. 2, in any suitable manner a selective process forms a zone 42 of N-type impurities into bulk portion 41. Typically, this zone is relatively heavily doped to have, for example, an effective surface sheet resistivity of about 10 to 30 ohms per square, a depth of about 5 microns, and an impurity concentration of antimony or arsenic of about $10^{19}$ per cubic centimeter. Zone 42 can serve as the collector of a bipolar transistor.

Figure 3:
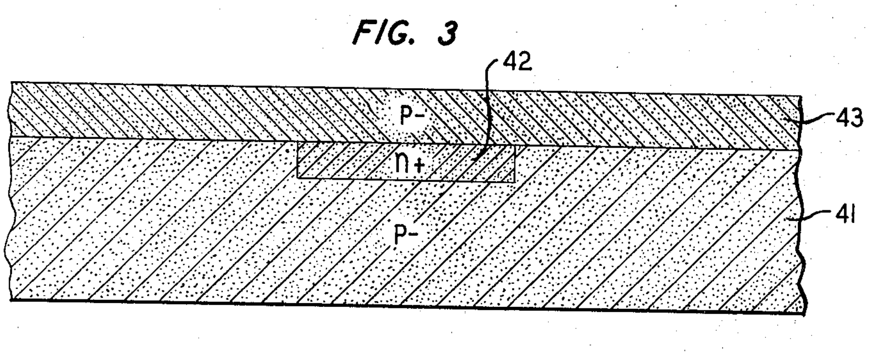

After forming zone 42, an epitaxial layer 43 is deposited in conventional fashion over the surface of bulk portion 41 and over zone 42 which thereby becomes buried as depicted in FIG. 3. Epitaxial layer 43 contains P-type impurities, for example boron, and typically has a resistivity of about 10 ohm-centimeters, an impurity concentration of about $10^{15}$ per cubic centimeter, and a thickness of about 3 microns.

Figure 4:
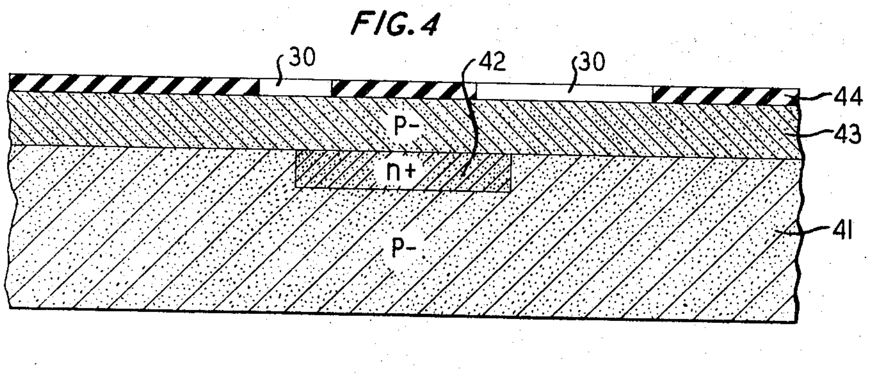
FIGS. 4 through 8 show the cross section of a semiconductor wafer as it appears after successive processing steps performed on the semiconductor wafer of FIG. 3 in accordance with a first-described embodiment of this invention which includes forming a semiconductor zone to provide isolation.

FIG. 4 shows a cross section of a semiconductive wafer fabricated further in accordance with a first-described embodiment of this invention by depositing a silicon nitride layer 44 on epitaxial layer 43 and then forming an annular-like void 30 using well known photolithographic techniques. Void 30 is shaped so silicon nitride layer 44 can be used as a mask for the implantation of N-type impurities, for example phosphorous, which will form a deep collector contact zone. Of course, if desired, layer 44 could be formed over an oxide layer or other insulator instead of directly over epitaxial layer 43. Additionally, if desired, an oxide layer could be formed over layer 44 and adapted to serve, in conjunction with layer 44, as an implantation mask.

Figure 5:
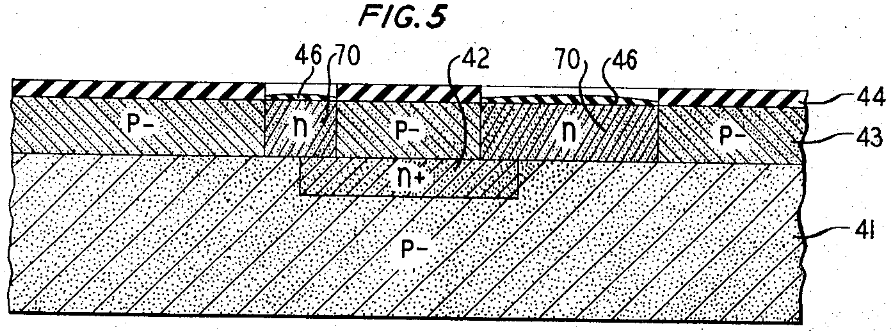

After implantation of the impurities, heating in an oxidizing atmosphere produces a cross section of a semiconductive wafer shown in FIG. 5 wherein implanted impurities have been diffused through the epitaxial layer 43 to produce a deep collector contact zone 70 which intersects zone 42. In this embodiment, the combination of zone 70 and zone 42 isolates the portion of epitaxial layer 43 above zone 42 from other such portions formed elsewhere in epitaxial layer 43.

This step of implanting impurities in zone 70 is considered a significant part of this invention. Since implantation includes inherently accurate control over the number of impurities introduced and therefore accurately controls the resistivity of zone 70, zone 70 can be advantageously used as a more accurately controlled series collector resistor. A typical sheet resistivity for zone 70 is about 300 ohms per square and a typical level of impurities at the zone's surface is about $5 \times 10^{17}$ per cubic centimeter. Zone 70 could alternatively be entirely formed by diffusion, but control over the number of impurities would not be as accurate.

FIG. 5 also shows an oxide cap 46 formed as a result of the heating in an oxidizing atmosphere and the selective masking effect of silicon nitride layer 44. The advantageous presence of silicon nitride layer 44 obviates an additional masking step. Subsequently, the silicon nitride layer 44 is easily removed by etching in a solution which does not appreciably attack oxide cap 46 or any of the semiconductor portions. A suitable solution is hot (about 160° C) phosphoric acid.

The inclusion of forming this perfectly aligned protective oxide cap 46 over region 70 is considered another significant part of this invention. In particular, oxide cap 46 is used to protect region 70 from a subsequent introduction of undesired impurities.

Figure 6:
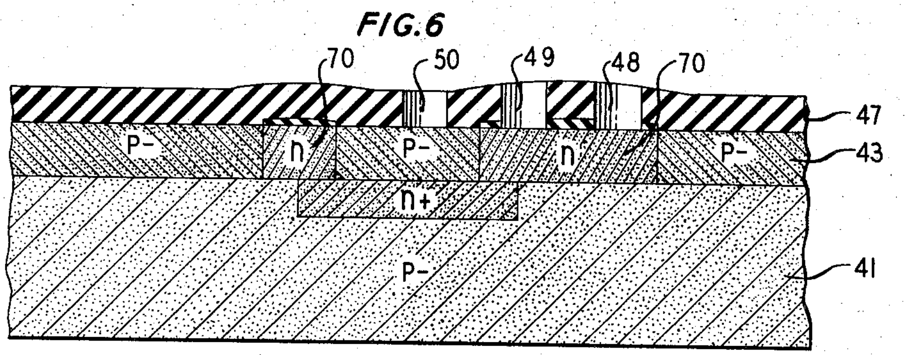

After removing silicon nitride layer 44, a doped oxide layer 47, shown in FIG. 6, containing P-type impurities is formed. Oxide layer 47 serves as an impurity source for a diffusion to provide improved ohmic contact to what will become a base zone as well as a mask for additional subsequent impurity introductions. Since a P-type diffusion is not desired where an N-type emitter is to be formed, the source of the diffusion from above the future emitter region is removed by forming void 50, as shown in FIG. 6.

When forming void 50, voids 48 and 49 are also formed above zone 70 to avoid a future additional masking step. Any potentially detrimental effect of any undesired impurities subsequently introduced into zone 70 through voids 48 and 49 is minimized by keeping the openings of voids 48 and 49 small in relation to the surface of zone 70. The spacing and placement of voids 48 and 49 are such as to enable the use of zone 70 as a circuit resistive element such as a series collector resistor. A connection through void 49 to the innermost section of zone 70 would include less resistance in series with collector zone 42 than a connection through void 48 to the outermost section. Obviously, intermediate openings could be made to achieve intermediate resistance values.

Subsequently, heating diffuses the impurities from oxide layer 47 into the upper portions of epitaxial layer 43 to form P+ zone 43A shown in FIG. 7. The concentration of the diffused impurity distribution decreases with increasing distance into the epitaxial layer. P+ zone 43A allows for improved ohmic contact to a subsequently to be formed active base region; and typically, has a sheet resistivity of about 200 ohms per square and an impurity level at the zone's surface of about $10^{19}$ per cubic centimeter.

Figure 7:
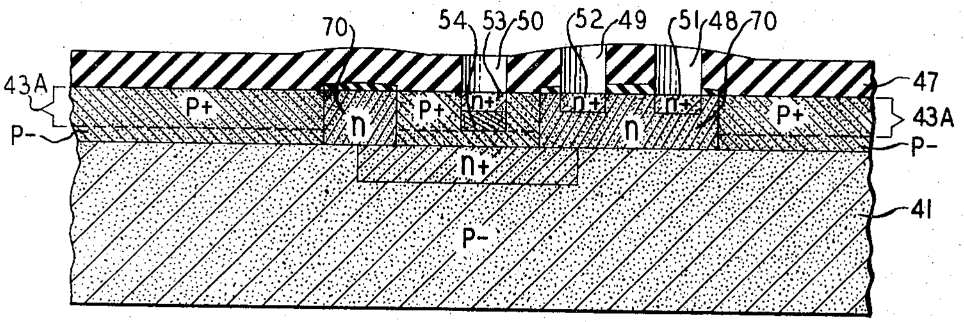

Oxide layer 47 also serves as a mask for implanting the P-type conductivity buried base zone 54 shown in FIG. 7. Typically, the sheet resistivity of implanted base zone 54 is about 5,000 to about 10,000 ohms per square and the impurity dose of boron about $5 \times 10^{12}$ per square centimeter. As a result of implanting into a crystalline structure, the concentration of the implanted buried base impurity distribution first increases then decreases with increasing distance into epitaxial layer 43. The peak buried base impurity concentration can, typically, be $10^{17}$ to $2 \times 10^{17}$ per cubic centimeter.

The distribution of implanted base impurities in base zone 54 should intersect the P+ diffusion distribution of P+ zone 43A to take advantage of the low resistivity path provided by P+ zone 43A from the buried base zone 54 to a subsequently to be formed base contact. Advantageously, to insure a continuous low resistivity path, the magnitude of the diffused P+ impurity concentration should be greater than the magnitude of the implanted base impurity concentration at a sufficient distance into the epitaxial layer. In particular, there is a practical minimum intersection of the two impurity distributions to ensure a low resistivity path in view of increasing resistivity at the edges of the distributions and processing variations in forming the two distributions. It is believed this practical minimum intersection can be defined by the requirement that at the distance into the epitaxial layer where the magnitude of the implanted base impurity concentration has increased to at least 10 percent of its peak concentration, the concentration of the diffused P+ impurity distribution should be greater than the concentration of the implanted base impurity distribution.

In addition to forming the buried base zone 54, the implantation introduces impurities into portions of zone 70 below voids 48 and 49 of FIG. 7. These impurities are not shown in the drawing because they are negligible with respect to the N concentrations already there and, if necessary, can be further neutralized by having a larger impurity dose when forming zone 70.

After the implantation, oxide layer 47 is used as a mask for the introduction of N-type impurities. As a result, zones 51 and 52 are formed below voids 48 and 49 as shown in FIG. 7. Zones 51 and 52 provide improved ohmic contact with zone 70. Additionally, below void 50, an emitter zone 53 is formed above buried base zone 54. The concentration of the emitter impurity distribution decreases with increasing distance into epitaxial layer 43. Emitter zone 53 and zones 51 and 52 can be formed by a phosphorous diffusion and have a sheet resistivity of about 30 ohms per square. Typically, the emitter is about 0.4 microns deep and has a peak impurity concentration at the surface of the epitaxial layer of about $10^{20}$ per cubic centimeter.

The impurities of emitter zone 53 compensate the implanted base impurities only where the relatively sparse tails of the two distributions intersect. It is desirable to minimize the compensation of the implanted base impurities so the number of impurities in the active base zone, which determines the transistor gain, is essentially the same as the number of implanted base impurities which number is very easily well controlled. As a practical maximum compensation, it is believed that at a distance into the epitaxial layer where the magnitude of the concentration of the implanted base impurities has increased to at most 5 percent of its peak concentration, the concentration of the emitter impurity distribution should be less than the concentration of the implanted base impurity distribution.

A significant part of our invention is the implanting of buried base zone 54. The buried base zone improves control of transistor gain not only because the number of implanted impurities are well controlled, but also because the buried base allows a greater tolerance of epitaxial layer thickness and emitter depth. That is, if as in prior art methods the impurities were uniformly distributed in the active base zone, instead of concentrated in an implanted zone, the distance of separation between the emitter and collector, which is determined by both the epitaxial layer thickness and the emitter depth into the epitaxial layer, would have a greater effect on the number of impurities and therefore on the gain. If the base impurity zone were not buried, but extended from the surface of the epitaxial layer, the emitter diffusion would affect substantially more base impurities per unit of intersecting distance and thus variation in emitter diffusion depth would have a much greater effect on the ability to control the number of base impurities and, in turn, gain.

Figure 8:
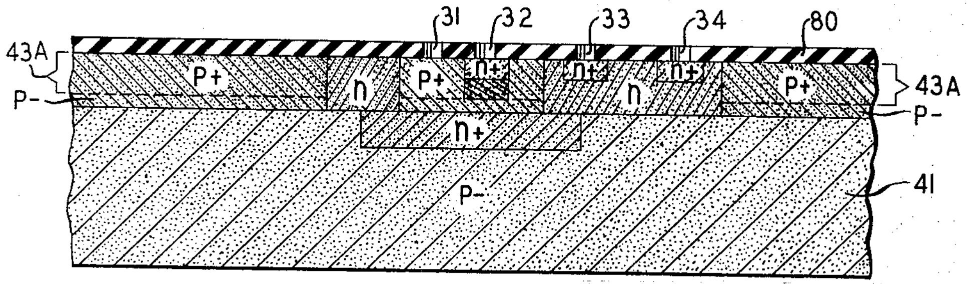

FIG. 8 shows a cross section of a semiconductor wafer substantially completely fabricated in accordance with the first-described embodiment of our invention. Oxide layer 47 and oxide cap 46 are removed and then an oxide coating 80 is formed on epitaxial layer 43. Using well known methods, openings for contacts are formed in oxide coating 80. That is, void 31 is for a base contact, void 32 is for an emitter contact, and voids 33 and 34 are for collector resistor contacts. Alternatively, coating 47 could be retained and used instead of coating 80.

Figure 9:
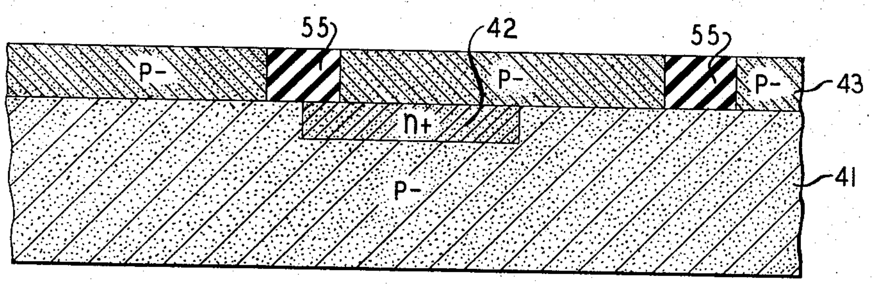
FIGS. 9 through 14 show the cross section of a semiconductor wafer as it appears after successive processing steps performed on the semiconductor wafer of FIG. 3 in accordance with a second-described embodiment of this invention which includes forming an oxide zone to provide isolation.

FIGS. 9 through 14 show cross sections of a semiconductor wafer produced by subsequent additional processing of the semiconductor wafer whose cross section is shown in FIG. 3 in accordance with a second embodiment of the invention. This second embodiment includes forming an additional appropriately shaped oxide zone 55, as shown in FIG. 9, to provide isolation instead of shaping the deep collector contact zone 70 to provide isolation as in the first embodiment. The oxide zone 55 is formed by well known masking and impurity introduction techniques.

Figure 10:
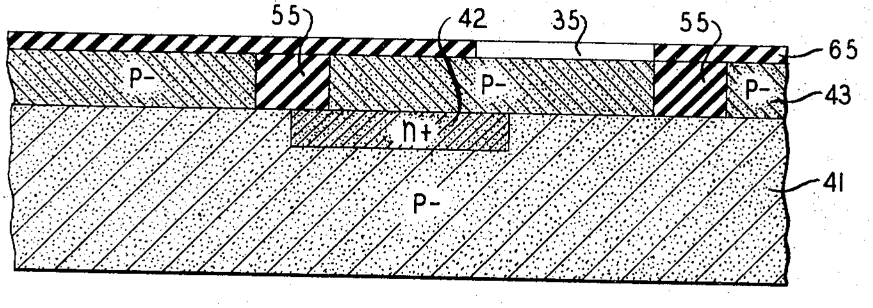
Figure 11:
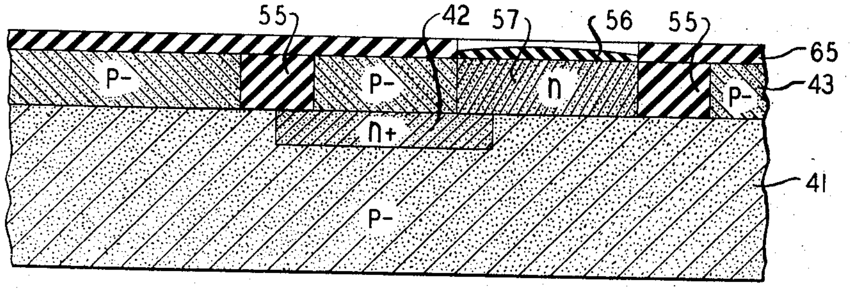
Figure 12:
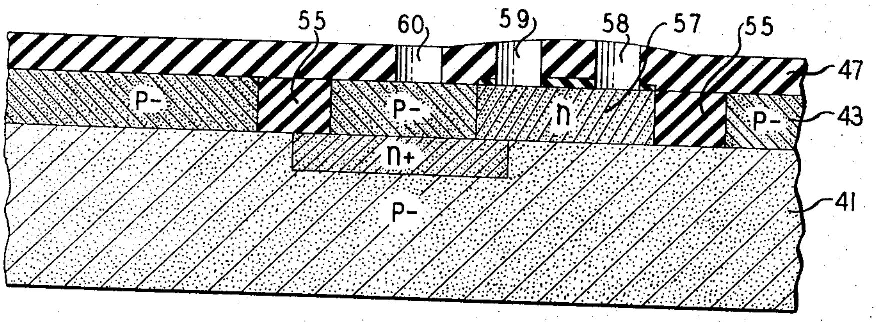
Figure 13:
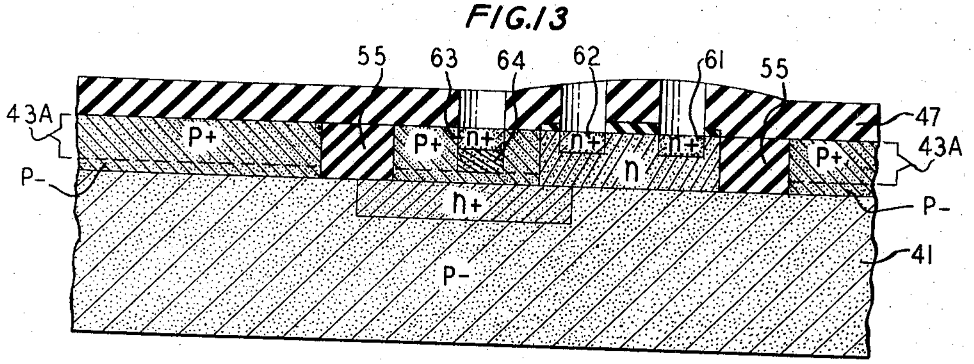
Figure 14:
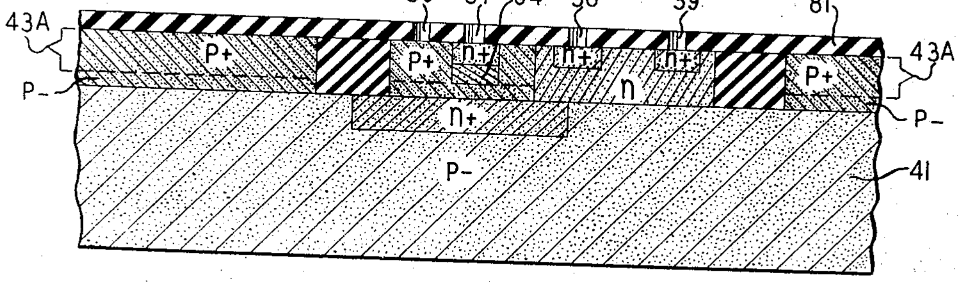

The remaining steps of the second embodiment closely parallel those of the first embodiment. FIG. 10 shows a cross section of a semiconductive wafer after forming a silicon nitride layer 65 and a void 35. Of course, if desired, layer 65 could be formed over an oxide layer or other insulator instead of directly over epitaxial layer 43. Additionally, if desired, an oxide layer could be formed over layer 65, and be adapted to serve in conjunction with layer 65 as a mask when forming a deep collector contact zone 57 shown in FIG. 11. As in the first embodiment, implanting the impurities of the deep collector contact zone is followed by heating in an oxidizing atmosphere. Hence, zone 57 corresponds to zone 70 produced by the first embodiment and an oxide cap 56 over zone 57 corresponds to oxide cap 46 produced by the first embodiment. Also paralleling the steps of the first embodiment the silicon nitride layer 65 is removed, an oxide layer 47 is formed over epitaxial layer 43, and voids 58, 59 and 60 are formed in layer 47, resulting in the cross section of a semiconductor wafer shown in FIG. 12. Still paralleling the previous embodiment, heating to form P+ zone 43A, implanting a buried base zone 64, forming an emitter zone 63, and forming improved ohmic contact zones 61 and 62, produce the cross section of a semiconductive wafer shown in FIG. 13. Finally, FIG. 14 shows the cross section of a semiconductive wafer after removing oxide layer 47 and oxide cap 56, forming an oxide coating 81, and forming voids 36, 37, 38 and 39 as in the previous embodiment.

In either embodiment, the proposed method offers the advantage of improved control of gain by implanting a buried base zone. This advantage allows a greater tolerance of epitaxial layer thickness and emitter depth for a given degree of control over gain. The method also provides an implanted zone with well controlled resistance which can be used as a series collector resistor and is protected from subsequent diffusions without additional processing steps.

Various modifications and variations will no doubt occur to those skilled in the various arts to which this invention pertains. For example, the use of N-type material for the substrate and epitaxial layer with corresponding substitution of P-type for the second conductivity type can be done to form PNP bipolar transistors and complementary structures. Similarly, replacing silicon nitride by other materials, such as aluminum oxide, which can be etched selectively with respect to oxide and which can be used to mask oxidation will also be apparent. Additionally, a Shottky diode can be produced by fabricating a metal contact directly on the surface of the deep collector region without first forming a heavily doped zone therein. Furthermore, the deep collector contact region can be adapted for use as a base zone in a lateral PNP transistor. In the lateral transistor, the P-type epitaxial layer on one side of the base zone can be adapted to serve as the emitter zone and the epitaxial layer on the opposite side of the base zone can be adapted to serve as the collector zone.

What is claimed is:

1. In a method for fabricating a semiconductor integrated circuit device including a transistor, comprising the steps of forming into the surface of a body of semiconductive material of a first conductivity type a first pattern comprising a plurality of zones of a second conductivity type, and forming an epitaxial layer of the first conductivity type over the surface of the body, the improvement being the steps of:

ion implanting into the epitaxial layer a second pattern of zones of impurities of the second conductivity type registered with zones of the first pattern;

heating in a manner sufficient to diffuse the impurities through the epitaxial layer and simultaneously to oxidize selectively the surface of the epitaxial layer above the second pattern of impurities;

ion implanting a buried base zone beneath and separated from the surface of the epitaxial layer; and forming an emitter zone extending inward from the surface of the epitaxial layer to the base zone.

2. A method as recited in claim 1 wherein the second pattern zones of the second conductivity type are provided by:

forming over the epitaxial layer a masking layer of a material capable of masking oxidation and etching selectively with respect to the oxide and to the semiconductor;

forming through the masking layer the second pattern comprising a plurality of spaced voids registered with separate ones of the zones of the first pattern;

ion implanting impurities of the second conductivity type into the areas beneath the voids of the second pattern;

heating in an oxidizing atmosphere sufficient to cause impurities of the second pattern to penetrate essentially completely through the epitaxial layer and sufficient simultaneously to form oxide regions on the surface of the epitaxial layer selectively in the voids in the masking layer; and removing the masking layer by etching in a solution which substantially affects neither the selectively formed oxide nor the semiconductor material.

3. A method as recited in claim 1 further comprising:

shaping the zones of the second pattern so separate zones of the second pattern form separate resistors in series with separate zones of the first pattern; and forming electrodes to contact separate zones of the second pattern so that greater resistance is obtained by placing an electrode at a greater distance from the serially connected zone of the first pattern.

4. A method as recited in claim 1 further comprising:

forming completely through the epitaxial layer a plurality of oxide regions each of which laterally surrounds at least one zone of the first pattern and at least one zone of the second pattern and thereby laterally isolates said last-mentioned zones from the remainder of the epitaxial layer.

5. A method as recited in claim 1 further comprising:

shaping separate zones of the second pattern to surround laterally at least one zone of the first pattern thereby isolating the portions of the epitaxial layer above said last-mentioned at least one zone from the remainder of the epitaxial layer.

6. A method as recited in claim 1 wherein the buried base zones and emitter zones are formed by:

depositing an oxide layer containing impurities of the first conductivity type;

forming a plurality of spaced voids to provide exposed regions of epitaxial layer above separate ones of the zones of the first pattern and above separate ones of the zones of the second pattern thereby producing a mask;

heating the oxide layer sufficient that oxide layer impurities of the first conductivity type diffuse into those portions of the epitaxial layer essentially only underneath the remainder of the oxide layer and form a distribution of first conductivity type impurities whose concentration decreases with increasing distance into the epitaxial layer;

ion implanting impurities of the first conductivity type into the epitaxial layer through the last mentioned spaced voids to form, over the zones of the first pattern, buried base zones having a distribution of first conductivity type impurities whose concentration first increases then decreases with increasing distance into the epitaxial layer; and introducing impurities of the second conductivity type through the last-mentioned spaced voids to form distributions of second conductivity type impurities whose concentration decreases with increasing distance into the epitaxial layer thereby producing emitter zones above the base zones and producing zones with improved ohmic contact characteristics above the second pattern zones.

7. A method as recited in claim 6 wherein the implantation of the base zones is sufficient that, at the distance into the epitaxial layer where the magnitude of the concentration of the implanted base impurity distribution has increased to at least 10 percent of its peak concentration, the concentration of the diffused first conductivity distribution is greater than the concentration of the implanted base impurity distribution.

8. A method as recited in claim 6 wherein the implantation of the base zones is sufficient that, at the distance into the epitaxial layer where the magnitude of the concentration of the implanted base impurity distribution has increased to at most 5 percent of its peak concentration, the concentration of the emitter impurity distribution is less than the concentration of the implanted base impurity distribution.

9. A method as recited in claim 6 wherein said epitaxial layer is of P-type conductivity silicon.

10. In a method for fabricating a semiconductor integrated circuit device including a transistor comprising the steps of forming into the surface of a body of semiconductive material of a first conductivity type a first pattern comprising a plurality of zones of a second conductivity type, and forming an epitaxial layer of the first conductivity type over the surface of the body, the improvement being the steps of:

forming into the epitaxial layer a second pattern of zones of impurities of the second conductivity type registered with zones of the first pattern;

depositing an oxide layer containing impurities of the first conductivity type;

forming a plurality of spaced voids to provide exposed regions of epitaxial layer above separate ones of the zones of the first pattern and above separate ones of the zones of the second pattern thereby producing a mask;

heating the oxide layer sufficient that oxide layer impurities of the first conductivity type diffuse into those portions of the epitaxial layer essentially only underneath the remainder of the oxide layer and form a distribution of first conductivity type impurities whose concentration decreases with increasing distance into the epitaxial layer;

ion implanting impurities of the first conductivity type into the epitaxial layer through the last mentioned spaced voids to form, over the zones of the first pattern, buried base zones having a distribution of first conductivity type impurities whose concentration first increases then decreases with increasing distance into the epitaxial layer; and introducing impurities of the second conductivity type through the last-mentioned spaced voids to form distributions of second conductivity type impurities whose concentration decreases with increasing distance into the epitaxial layer thereby producing emitter zones above the base zones and producing zones with improved ohmic contact characteristics above the second pattern zones.

11. A method as recited in claim 10 wherein the second pattern zones of the second conductivity type are provided by:

forming over the epitaxial layer a masking layer of a material capable of masking oxidation and etching selectively with respect to the oxide and to the semiconductor;

forming through the masking layer the second pattern comprising a plurality of spaced voids registered with separate ones of the zones of the first pattern;

ion implanting impurities of the second conductivity type into the areas beneath the voids of the second pattern;

heating in an oxidizing atmosphere sufficient to cause the impurities of the second pattern to penetrate essentially completely through the epitaxial layer and sufficient simultaneously to form oxide regions on the surface of the epitaxial layer selectively in the voids in the masking layer; and removing the masking layer by etching in a solution which substantially affects neither the selectively formed oxide nor the semiconductor material.

12. In a method for fabricating a semiconductor integrated circuit device including a transistor comprising the steps of forming into the surface of a body of semiconductive material of a first conductivity type a first pattern comprising a plurality of zones of a second conductivity type, and forming an epitaxial layer of the first conductivity type over the surface of the body, the improvement being the steps of:

forming over the epitaxial layer a masking layer of a material capable of masking oxidation and etching selectively with respect to the oxide and to the semiconductor;

forming through the masking layer a second pattern comprising a plurality of spaced voids registered with separate ones of the zones of the first pattern;

ion implanting impurities of the second conductivity type into the areas beneath the voids of the second pattern;

heating in an oxidizing atmosphere sufficient to cause the impurities of the second pattern to penetrate essentially completely through the epitaxial layer and sufficient simultaneously to form oxide regions on the surface of the epitaxial layer selectively in the voids in the masking layer;

removing the masking layer by etching in a solution which substantially affects neither the selectively formed oxide nor the semiconductor material;

ion implanting buried base zones beneath and separated from the surface of the epitaxial layer; and forming emitter zones extending inward from the surface of the epitaxial layer to the base zones.

13. A method as recited in claim 12 wherein the buried base zones and emitter zones are formed by:

depositing an oxide layer containing impurities of the first conductivity type;

forming a plurality of spaced voids to provide exposed regions of epitaxial layer above separate ones of the zones of the first pattern and exposed regions of epitaxial layer above separate ones of the zones of the second pattern thereby producing a mask;

heating the oxide layer sufficient that oxide layer impurities of the first conductivity type diffuse into those portions of the epitaxial layer essentially only underneath the remainder of the oxide layer and form a distribution of first conductivity type impurities whose concentration decreases with increasing distance into the epitaxial layer;

ion implanting impurities of the first conductivity type into the epitaxial layer through the last mentioned spaced voids to form, over the zones of the first pattern, buried base zones having a distribution of first conductivity type impurities whose concentration first increases then decreases with increasing distance into the epitaxial layer; and introducing impurities of the second conductivity type through the last-mentioned spaced voids to form distributions of second conductivity type impurities whose concentration decreases with increasing distance into the epitaxial layer thereby producing emitter zones above the base zones and producing zones with improved ohmic contact characteristics above the second pattern zones.

14. In a method for fabricating a semiconductor integrated circuit device including a transistor comprising the steps of forming into the surface of a body of semiconductive material of a first conductivity type a first pattern comprising a plurality of zones of a second conductivity type, and forming an epitaxial layer of the first conductivity type over the surface of the body, the improvement being the steps of:

forming over the epitaxial layer a masking layer of a material capable of masking oxidation and etching selectively with respect to the oxide and to the semiconductor;

forming through the masking layer a second pattern comprising a plurality of spaced voids registered with separate ones of the zones of the first pattern;

ion implanting impurities of the second conductivity type into the areas beneath the voids of the second pattern;

heating in an oxidizing atmosphere sufficient to cause the impurities of the second pattern to penetrate essentially completely through the epitaxial layer and sufficient simultaneously to form oxide regions on the surface of the epitaxial layer selectively in the voids in the masking layer;

removing the masking layer by etching in a solution which substantially affects neither the selectively formed oxide nor the semiconductor material;

depositing an oxide layer containing impurities of the first conductivity type;

forming a plurality of spaced voids to provide exposed regions of epitaxial layer above separate ones of the zones of the first pattern and exposed regions of epitaxial layer above separate ones of the zones of the second pattern thereby producing a mask;

heating the oxide layer sufficient that oxide layer impurities of the first conductivity type diffuse into those portions of the epitaxial layer essentially only underneath the remainder of the oxide layer and form a distribution of first conductivity type impurities whose concentration decreases with increasing distance into the epitaxial layer;

ion implanting impurities of the first conductivity type into the epitaxial layer through the last-mentioned spaced voids to form, over the zones of the first pattern, buried base zones having a distribution of first conductivity type impurities whose concentration first increases then decreases with increasing distance into the epitaxial layer; and introducing impurities of the second conductivity type through the last-mentioned spaced voids to form distributions of second conductivity type impurities whose concentration decreases with increasing distance into the epitaxial layer thereby producing emitter zones above the base zones and producing zones with improved ohmic contact characteristics above the second pattern zone.

* * * * *